United States Patent
Dennison

(10) Patent No.: US 6,744,088 B1
(45) Date of Patent: Jun. 1, 2004

(54) PHASE CHANGE MEMORY DEVICE ON A PLANAR COMPOSITE LAYER

(75) Inventor: Charles H. Dennison, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/319,753

(22) Filed: Dec. 13, 2002

(51) Int. Cl.[7] ............................................. H01L 27/108
(52) U.S. Cl. ........................ 257/296; 257/298; 257/308; 257/300
(58) Field of Search ................................ 257/296–310

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 5,296,716 A | 3/1994 | Ovshinsky et al. |
| 5,789,758 A | 8/1998 | Reinberg |
| 5,879,955 A | 3/1999 | Gonzalez et al. |
| 5,920,788 A | 7/1999 | Reinberg |
| 5,933,365 A | 8/1999 | Klersy et al. |
| 5,970,336 A | 10/1999 | Wolstenholme et al. |
| 5,998,244 A | 12/1999 | Wolstenholme et al. |
| 6,002,140 A | 12/1999 | Gonzalez et al. |
| 6,031,287 A | 2/2000 | Harshfield |
| 6,085,341 A | 7/2000 | Greason et al. |
| 6,087,674 A | 7/2000 | Ovshinsky et al. |
| 6,141,241 A | 10/2000 | Ovshinsky et al. |
| 6,153,890 A | 11/2000 | Wolstenholme et al. |
| 6,229,157 B1 | 5/2001 | Sandhu |

OTHER PUBLICATIONS

U.S. patent application, pending, 09/896,008, filed Jun. 30, 2001, Huei–Min Ho et al. (P11410).
U.S. patent application, pending, 10/036,833, filed Dec. 31, 2001, Mac Apodaca et al. (P13085).

*Primary Examiner*—Fetsum Abraham
(74) *Attorney, Agent, or Firm*—Blakely, Sokoloff, Taylor & Zafman LLP

(57) ABSTRACT

Briefly, in accordance with an embodiment of the invention, a phase change memory and a method to manufacture a phase change memory is provided. The phase change memory may include an electrode, an adhesive material, an insulating material between the electrode and the adhesive material, wherein a portion of the adhesive material, a portion of the insulating material, and a portion of the electrode form a substantially planar surface. The phase change memory may further include a phase change material on the substantially planar surface and contacting the electrode, the adhesive material, and the insulating material.

26 Claims, 13 Drawing Sheets

PHASE CHANGE MEMORY DEVICE ON A PLANAR COMPOSITE LAYER

BACKGROUND

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states.

Typical materials suitable for such application include those utilizing various chalcogenide elements. The state of the phase change materials are also non-volatile in that, when set in either a crystalline, semi-crystalline, amorphous, or semi-amorphous state representing a resistance value, that value is retained until reset as that value represents a phase or physical state of the material (e.g., crystalline or amorphous).

A phase change memory cell may comprise a phase change material disposed on a dielectric material. However, some dielectric materials and phase change materials may not chemically bond well together. As a result, the layer of phase change material may peel during subsequent manufacturing of the phase change device, which in turn, may affect the yield or reliability of the device.

Thus, there is a continuing need for alternate ways to manufacture phase change memory devices.

BRIEF DESCRIPTION OF THE DRAWINGS

The subject matter regarded as the invention is particularly pointed out and distinctly claimed in the concluding portion of the specification. The present invention, however, both as to organization and method of operation, together with objects, features, and advantages thereof, may best be understood by reference to the following detailed description when read with the accompanying drawings in which:

Figure 1:
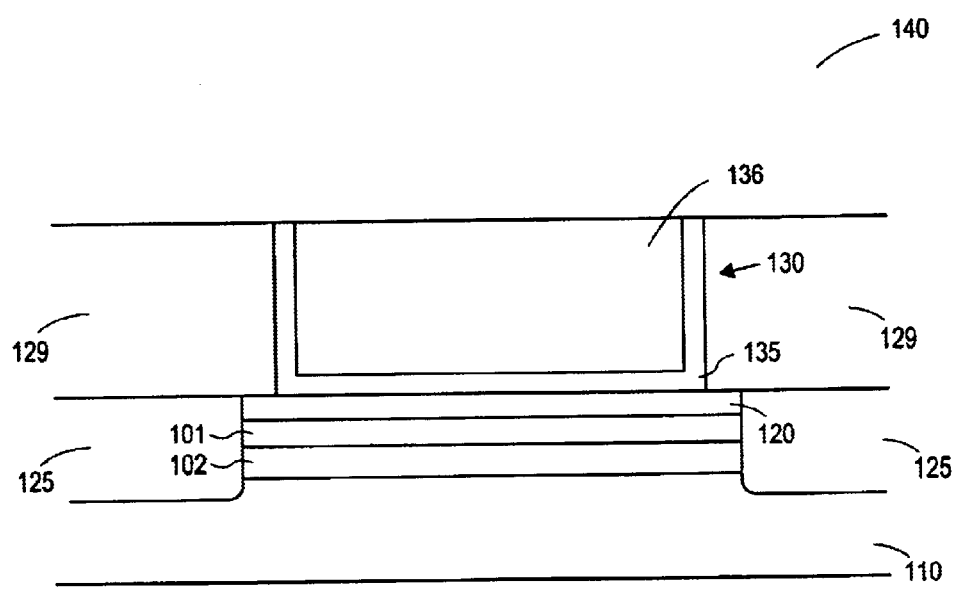
FIG. 1 is a cross-sectional view of a portion of a memory element during fabrication in accordance with an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the present invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Figure 8:
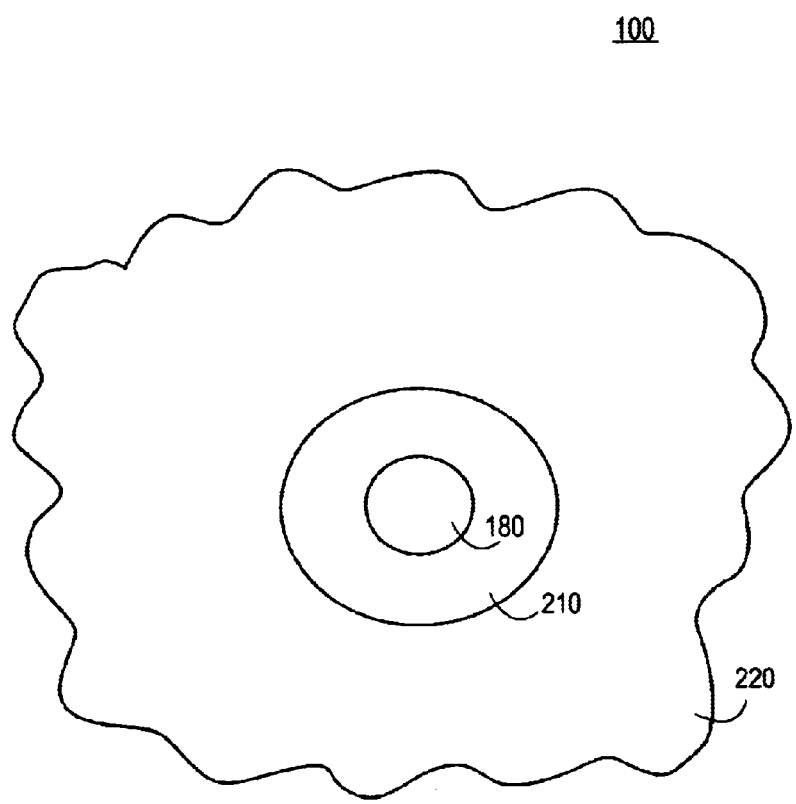
FIG. 8 is a top view of the structure of FIG. 7 at the stage of fabrication illustrated in FIG. 7.
Figure 9:
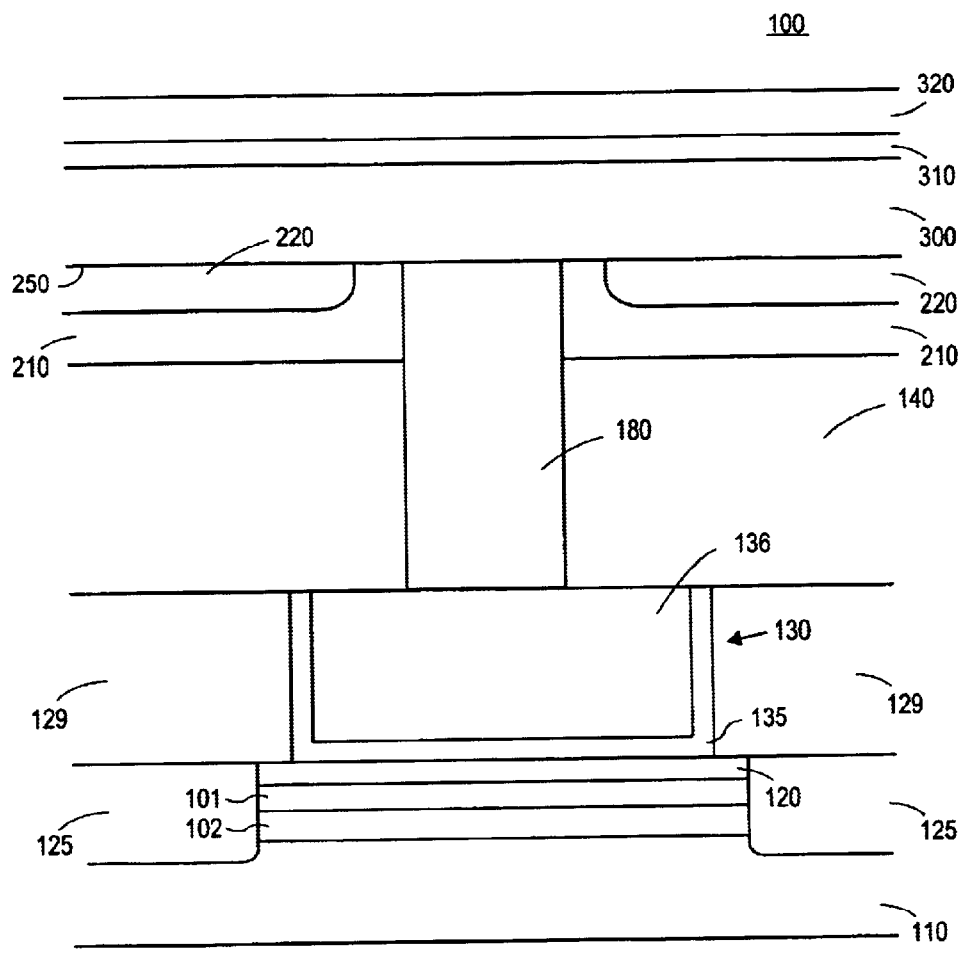
FIG. 9 is a cross-sectional view of the structure of FIG. 7 at a later stage of fabrication.
Figure 10:
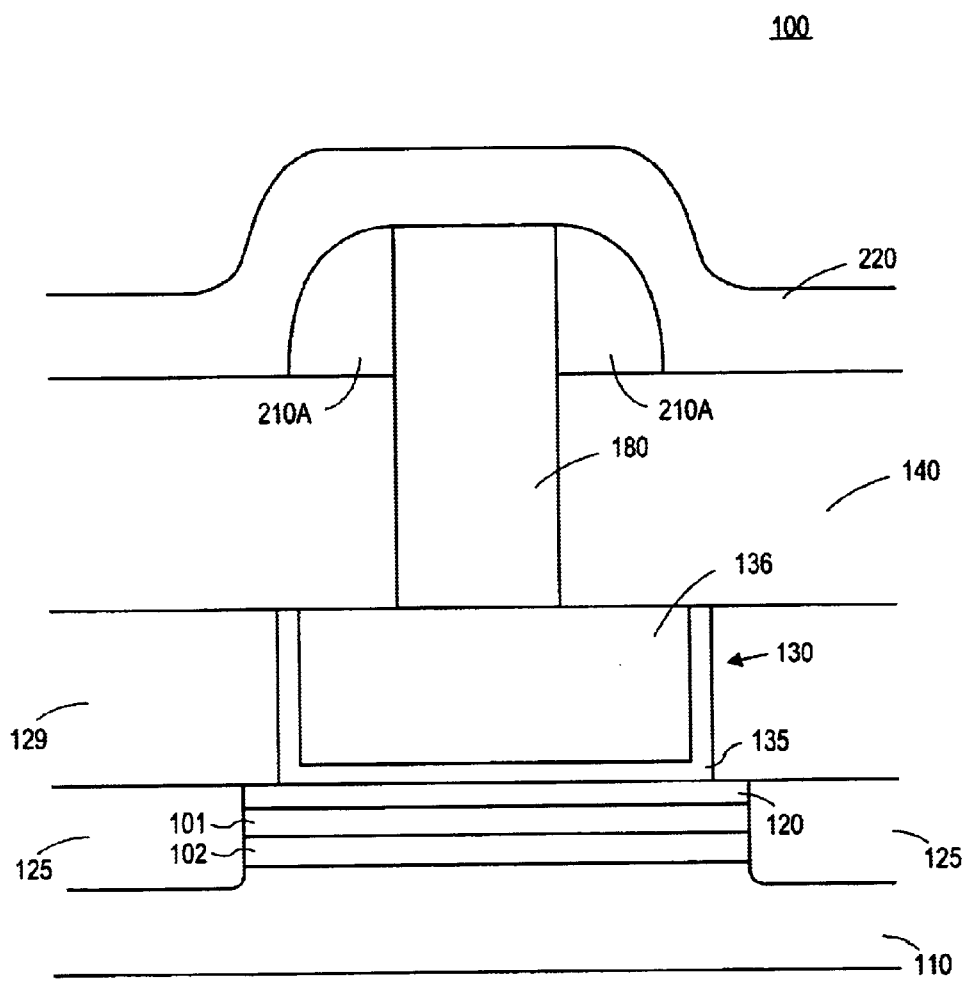
FIG. 10 is a cross-sectional view of the structure of FIG. 5 at a later stage of fabrication in accordance with another embodiment of the present invention.
Figure 11:
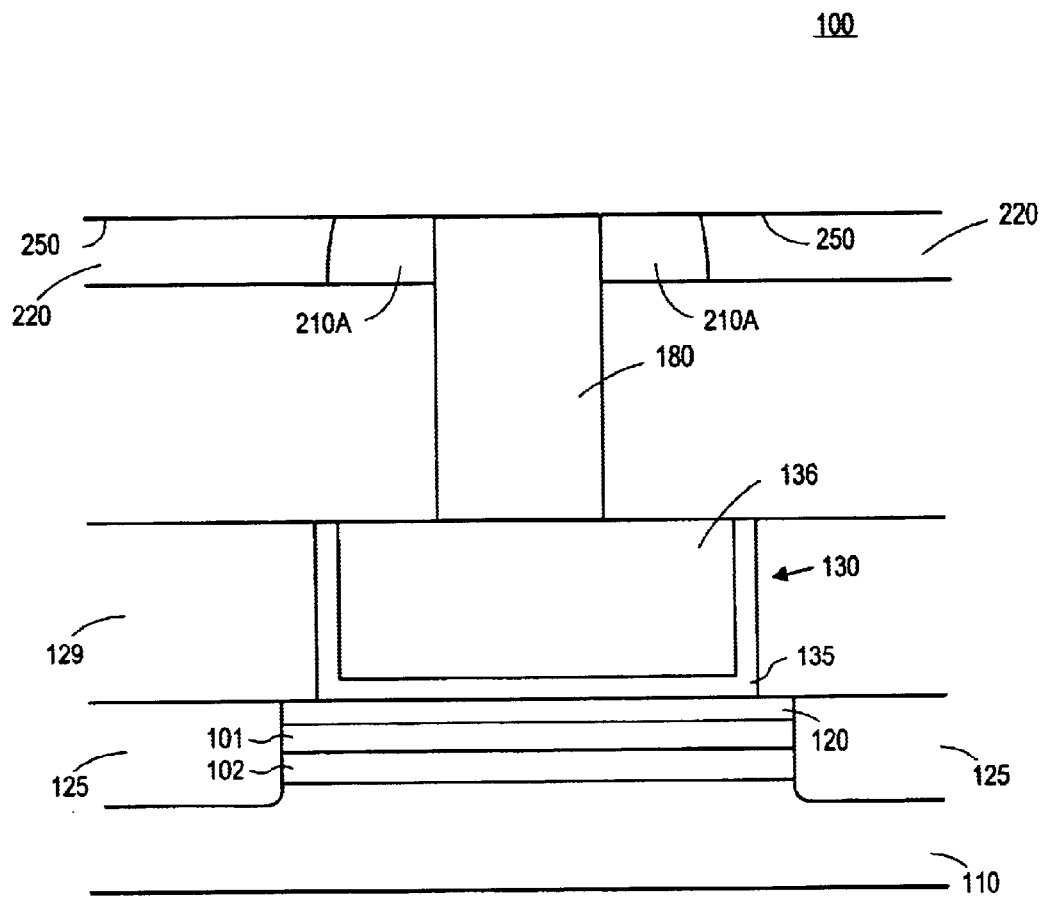
FIG. 11 is a cross-sectional view of the structure of FIG. 10 at a later stage of fabrication.

FIGS. 1–9 may be used to illustrate one embodiment of the fabrication of a memory element 100 and FIGS. 10 and 11 may be used to illustrate another embodiment to manufacture memory element 100. What is shown in FIG. 1 is a substrate 110 such as, for example, a semiconductor substrate (e.g., a silicon substrate), although the scope of the present invention is not limited in this respect. Other suitable substrates may be, but are not limited to, substrates that contain ceramic. material, organic material, or a glass material.

A reducer material 120 of, in one embodiment, a refractory metal silicide such as, for example, a cobalt silicide (CoSi2) may be formed over a portion of substrate 110. Reducer material 120 may be formed on top of either a P+ or N+ doped junction that either could be part of a diode or a source/drain region of a MOS transistor.

In the embodiment illustrated in FIG. 1, reducer material 120 may be formed over a P+ region 101, which may be formed over a N region 102. Regions 101 and 102 may form a PN diode.

P+ region 101 may be formed by introducing a P-type dopant such as, for example, boron, in substrate 110. In one example, a suitable concentration of a P-type dopant is on the order of above about $5 \times 10^{18}$ to about $1 \times 10^\circ$ atoms per cubic centimeters (atoms/cm3), which may be represented as P+. N region 102 may be a CMOS N-well on a P-substrate wafer, an N-well of a N-substrate wafer, or a buried N-well word line (e.g., BWL in a diode matrix array).

Reducer material 120, in one aspect, may serve as a relatively low resistance material in the fabrication of peripheral circuitry, e.g., addressing circuitry (not shown in FIG. 1). Reducer material 120 is not required in terms of forming a memory element as described, however, reducer material 120 may be included in memory element 100 between a phase change material (not shown in FIG. 1) and an isolation device or switching device such as, for example, a diode, or a transistor (not shown in FIG. 1). Reducer material 120 may be formed by introducing a refractory metal (e.g., cobalt) into a portion of substrate 110.

Memory element 100 may also include shallow trench isolation (STI) structures 125. STI structures 125 may serve to isolate individual memory elements from one another as well as associated circuit elements (e.g., transistor devices) formed in and on the substrate. In one embodiment, STI structure 125 may be an oxide or silicon dioxide, although the scope of the present invention is not limited in this respect.

A conductive plug 130 may be formed overlying reducer material 120. Conductive plug 130 may serve as a relatively low resistance path to provide current to a programmable material, such as a phase change material (not shown in FIG. 1). Conductive plug 130 may include an outer U-shaped barrier material 135 and an inner conductive material 136. Although the scope of the present invention is not limited in this respect, barrier material 135 may be a conductive material. Barrier material 135 may be titanium nitride (TiN) or tantalum nitride (TaN). Conductive material 136 may be tungsten (W) or copper (Cu).

A layer of insulating material 129 may be formed over substrate 110. An opening (not shown in FIG. 1) may be formed in insulating material 129, and conductive plug 130 may be formed in this opening, wherein insulating material 129 surrounds conductive plug 130. Examples of insulating material 129 may include an oxide, nitride, or a low K dielectric material, although the scope of the present invention is not limited in this respect.

A layer of insulating material 140 may be formed overlying insulating material 129 and a portion of conductive plug 130. Insulating material 140 may be an electrically insulating material. Insulating material 140 may also be a thermally insulating material. Examples of insulating material 140 may include an oxide, nitride, or a low K dielectric material, although the scope of the present invention is not limited in this respect. Insulating material 140 may have a thickness ranging from about 500 angstroms (Å) to about 3,000 angstroms, although the scope of the present invention is not limited in this respect.

Figure 2:
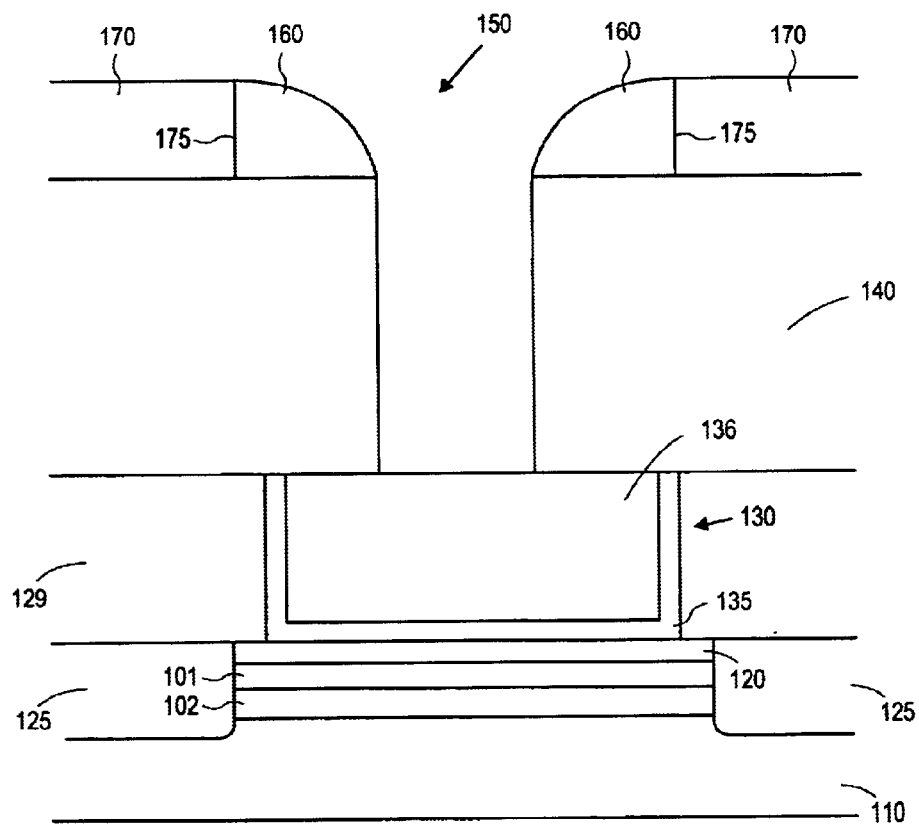
FIG. 2 is a cross-sectional view of the structure of FIG. 1 at a later stage of fabrication in accordance with an embodiment of the present invention.

Turning to FIG. 2, a hole or opening 150 having sidewalls 155 may be formed by etching insulating material 140. Opening 150 may be a via or a trench, although the scope of the present invention is not limited in this respect.

In one embodiment, opening 150 may be formed using photolithographic and etch techniques. As an example, opening 150 may be formed by applying a layer of photoresist material (not shown) on insulating material 140 and exposing this photoresist material to light. A mask (not shown) may be used to expose selected areas of the photoresist material, which defines areas to be removed, i.e., etched. The etch may be a chemical etch, which may be referred to as a wet etch. Or, the etch may be an electrolytic or plasma (ion bombardment) etch, which may be referred to as a dry etch. In one embodiment, the etch may be an anisotropic etch using a dry plasma etch, although the scope oft the present invention is not limited in this respect. If opening 150 is formed using photolithographic techniques, the diameter or width of opening 150 may be at least one feature size.

The feature size of a structure may refer to the minimum dimension achievable using photolithography. For example, the feature size may refer to a width of a material or spacing of materials in a structure. As is understood, photolithography refers to a process of transferring a pattern or image from one, medium to another, e.g., as from a mask to a wafer, using ultra-violet (UV) light. The minimum feature size of the transferred pattern may be limited by the limitations of the UV light. Distances, sizes, or dimensions less than the feature size may be referred to as sub-lithographic distances, sizes, or dimensions. For example, some structures may have feature sizes of about 2500 angstroms. In this example, a sub-lithographic distance may refer to a feature having a width of less than about 2500 angstroms.

Several techniques may be used to achieve: sub-lithographic dimensions. Although the scope of the present invention is not limited in this respect, phase shift mask, electron beam lithography, or x-ray lithography may be used to achieve sub-lithographic dimensions. Electron beam lithography may refer to a direct-write lithography technique using a beam of electrons to expose resist on a wafer. X-ray lithography may refer to a lithographic process for transferring patterns to a silicon wafer in which the electromagnetic radiation used is X-ray, rather than visible radiation. The shorter wavelength for X-rays (e.g., about 10–50 angstroms, versus about 2000–3000 angstroms for ultra-violet radiation) may reduce diffraction, and may be used to achieve feature sizes of about 1000 angstroms. Also, sidewall spacers may be used to achieve sub-lithographic dimensions. FIG. 2 may be used to illustrate the use of sidewall spacers 160 to achieve sub-lithographic dimensions.

FIG. 2 depicts the structure of FIG. 1, through the same cross-sectional view, after forming optional sidewall spacers 160. In one embodiment, sidewall spacers 160 may be formed along sidewalls 175 of a hard mask material 170. The distance between sidewalls 175 may be one feature size and may be formed using photolithographic and etch techniques. Sidewall spacers 160 may be formed by depositing a layer of material in the space between sidewalls 175 and patterning this material using a dry etch such as, for example, an anisotropic etch.

The distance between sidewall spacers 160 may be sub-lithographic. After sidewall spacers 160 are formed, in one embodiment, another anisotropic etch may be used to form an opening 150 having a sub-lithographic diameter. For example, in one embodiment, insulating material 140 may be anisotropically etched using an etching agent that is selective such that the etching agent stops at, or preserves, conductive plug 130. As shown in FIG. 2, the etching operation exposes a portion of conductive plug 130 through opening 150. In one aspect, sidewall spacers 160 may serve to reduce the quantity of electrode material (180 shown in FIG. 3) formed in opening 150. In one embodiment, the diameter of opening 150 may be less than about 1000 angstroms, although the scope of the present invention is not limited in this respect.

Although the scope of the present invention is not limited in this respect, hard mask material 170 may be polycrystalline silicon, amorphous silicon, or silicon nitride. Hard mask material 170 may have a thickness ranging from about 1,000 angstroms to about 3,000 angstroms, although the scope of the present invention is not limited in this respect. Sidewall spacers 160 may be formed from a variety of materials such as, for example, poly or amorphous silicon, silicon nitride oxide, or oxide nitride.

It should be pointed out that the use of sidewall spacers 160 to form opening 150 is not a limitation of the present invention. Other sub-lithographic methods, as mentioned above, may be used to form opening 150, wherein opening 150 may have a sub-lithographic diameter. Or, in alternate embodiments, opening 150 may be formed using photolithographic techniques and may therefore, have a diameter of greater than or equal to about one feature size.

Figure 3:
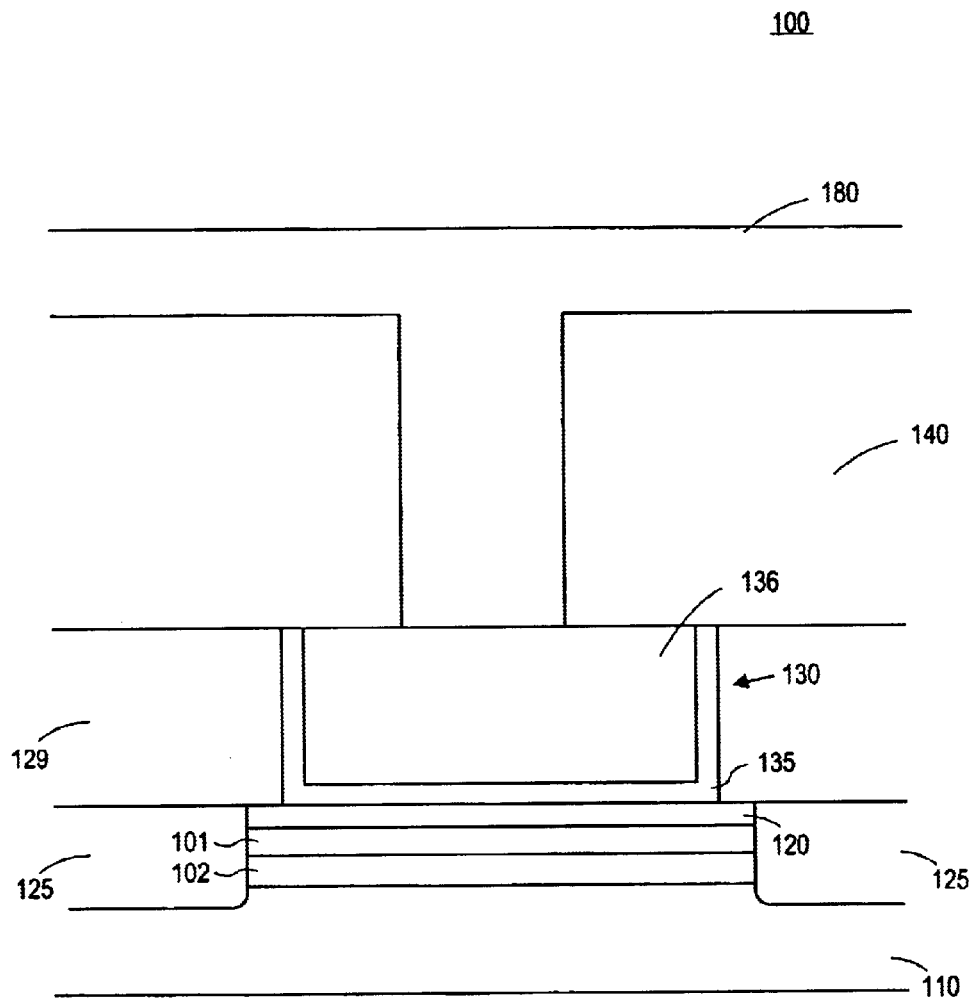
FIG. 3 is a cross-sectional view of the structure of FIG. 2 at a later stage of fabrication.

FIG. 3 illustrates memory element 100 after the conformal deposition of an electrode material 180 over insulating material 140 and in opening 150 (FIG. 2). FIG. 3 has been simplified by illustrating memory element 100 without either sidewall spacers 160 or hard mask material 170 or subsequent to the removal of materials 160 and 170. Spacers 160 or hard mask material 170 may be selectively removed using, for example, an etch or a chemical-mechanical polish (CMP). As discussed above, some embodiments may use sidewall spacers 160 to form opening 150 (FIG. 2), and other embodiments may not use sidewall spacers to form opening 150.

In one embodiment, electrode material 180 may be a layer of carbon or a semi-metal such as a transition metal, including but not limited to titanium, tungsten, titanium nitride (TiN), titanium aluminum nitride (TiAlN), or titanium silicon nitride (TiSiN). As an example, electrode material 180 may be formed with a chemical vapor deposition (CVD) process, however, the scope of the present invention is not limited by the particular process used to form electrode material 180. It should also be understood that alternative processes may be used to form electrode material 180.

Following introduction of electrode material 180, the structure shown in FIG. 3 may be subjected to a planarization that removes a portion of electrode material 180 and possibly a portion of insulating layer 140. Suitable planarization techniques may include a chemical or chemical-mechanical polish (CMP) technique.

Figure 4:
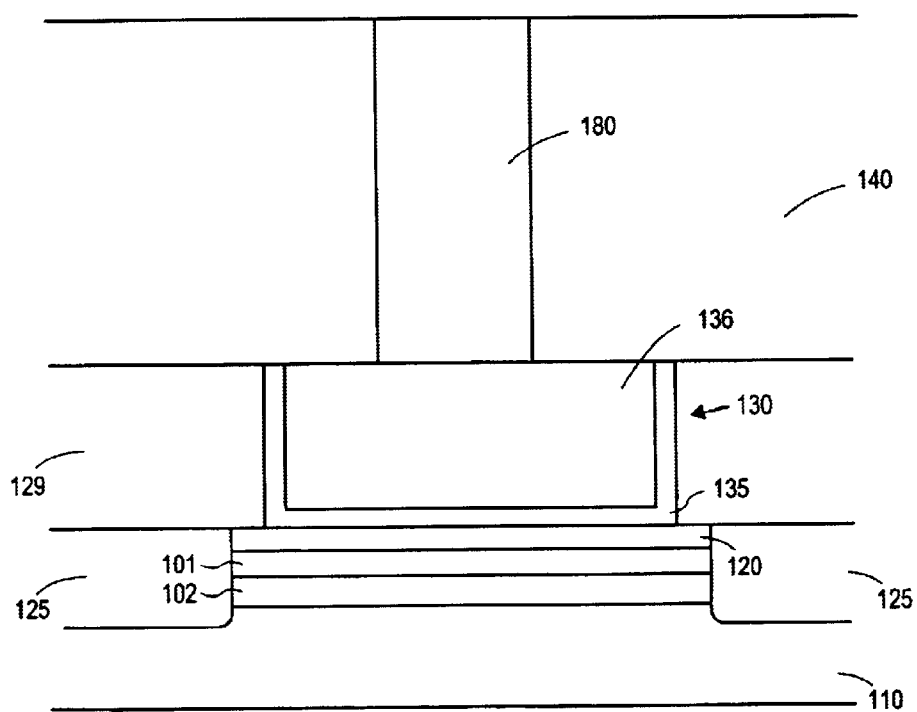
FIG. 4 is a cross-sectional view of the structure of FIG. 3 at a later stage of fabrication.

FIG. 4 illustrates the structure shown in FIG. 3 after removal of a portion of electrode material 180. A portion of electrode material 180 may be removed by patterning or segmenting material 180. In one embodiment, a portion of material 180 may be removed using, for example, a CMP process. It should also be understood that alternative processes may be used to remove a portion of electrode material 180. For example, a blanket etch may be used to remove portions of electrode material 180.

Figure 5:
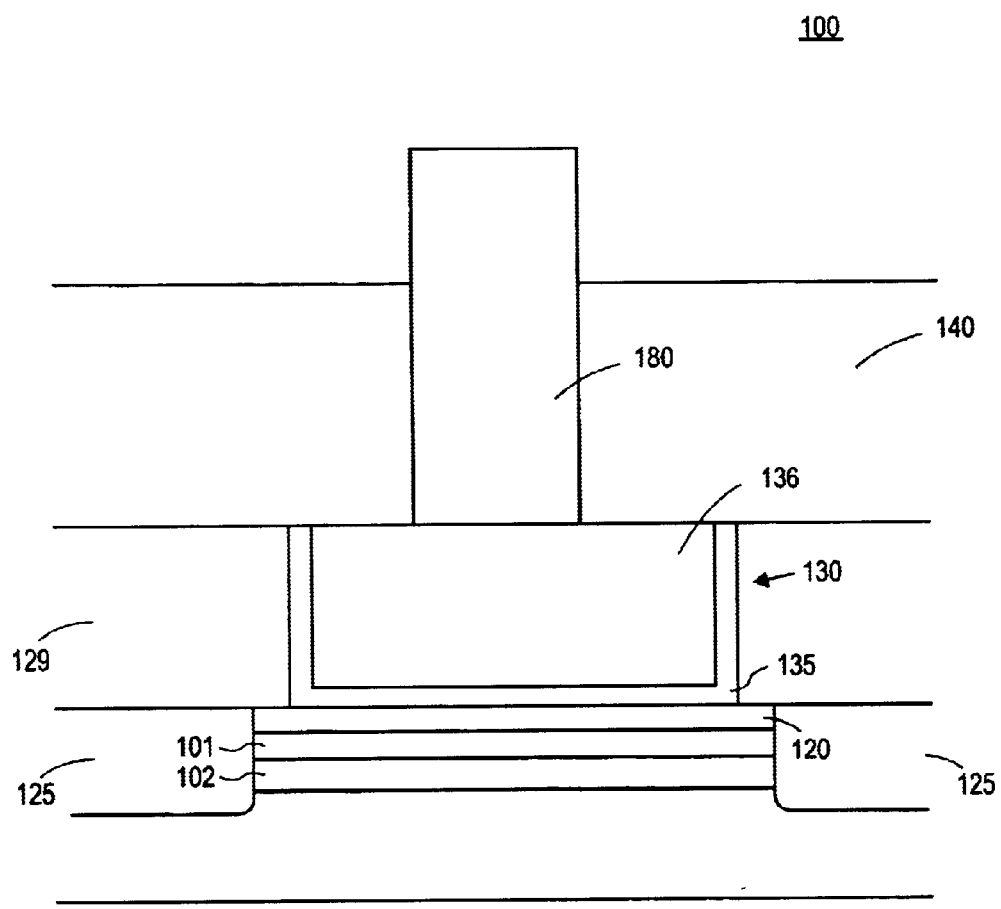
FIG. 5 is a cross-sectional view of the structure of FIG. 4 at a later stage of fabrication.

FIG. 5 illustrates memory element 100 after the removal of portions of insulating material 140. In one embodiment, insulating layer 140 may be recessed or etched back to expose a portion of the sidewalls of electrode material 180. In one embodiment, approximately 1000 to about 3000 angstroms of insulating layer 140 may be removed using a wet or selective etch back, e.g., a selective oxide etch diluted with hydrofluoric acid (HF). Alternatively, a dry etch may also be used. Electrode material 180 at this stage of processing may be referred to as a lance structure or a pillar structure and may serve as a lower electrode of memory element 100.

Figure 6:
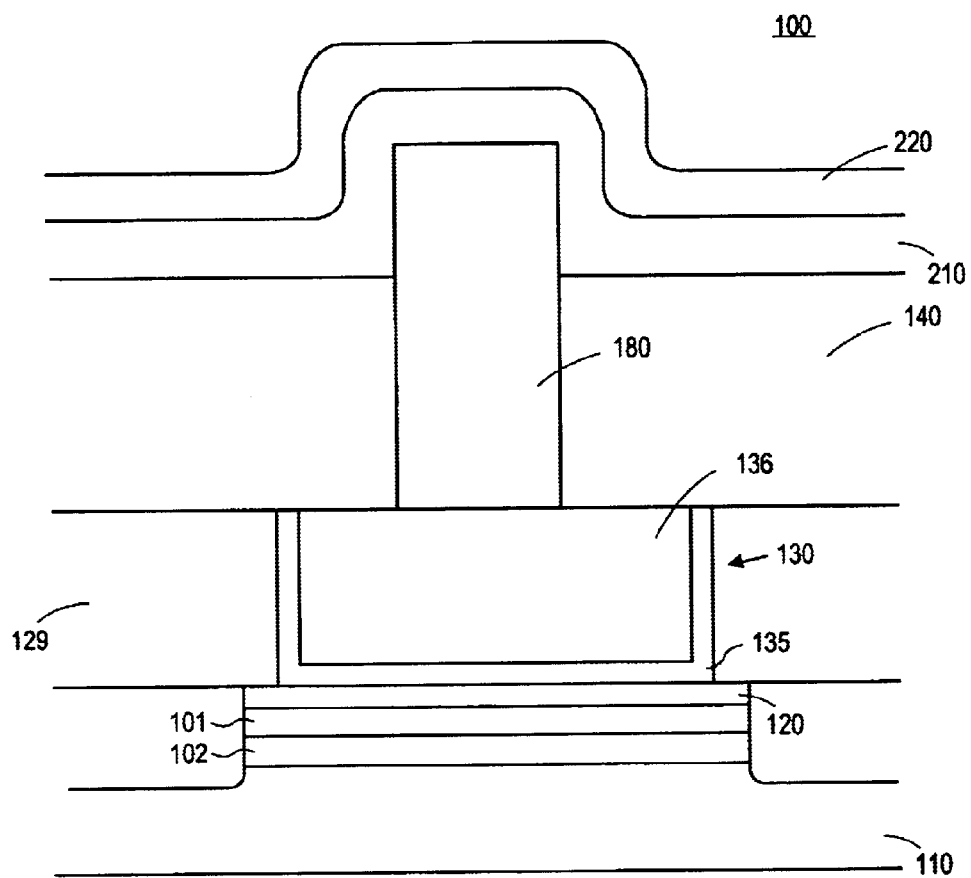
FIG. 6 is a cross-sectional view of the structure of FIG. 5 at a later stage of fabrication.

FIG. 6 illustrates the structure of FIG. 5 at a later stage of fabrication. FIG. 6 illustrates memory element 100 after the conformal forming of an insulating material 210 on a top surface of insulating material 140, along the sidewalls of electrode material 180, and on a top surface of electrode material 180. In other words, insulating material 210 may be formed surrounding and contacting an upper portion of electrode material 180.

Insulating material 210 may be a electrically and/or thermally insulating material such as, for example, an oxide, a nitride, a low K dielectric material, any other relatively low thermally conductive material, or any other relatively low electrically conductive material. Insulating material 210 may be used to provide electrical and/or thermal isolation for memory element 100. Using an insulating material to surround electrode 180 may increase the efficiency of memory element 100 during programming. Further, using an insulating material that has relatively high thermal insulating properties may increase heating efficiency (e.g., reduce heat loss) and may reduce the amount of electrical current used during programming of memory element 100.

The thickness and the technique used to formed insulating layer 210 may be selected depending on the desired characteristics of memory element 100. In one embodiment, insulating material 210 may have a thickness ranging from about 500 angstroms to about 2,500 angstroms, although the scope of the present invention is not limited in this respect. In one embodiment, insulating material 210 may be formed using a low pressure chemical vapor deposition (LPCVD) or plasma enhanced chemical vapor deposition (PECVD) process.

A layer of a material 220 may be formed overlying insulating layer 210. Material 220 may be an electrically conductive or a thermally conductive material. Material 220 may serve as an adhesive material suitable for adhering to a phase change material (e.g., phase change material 300 in FIG. 9), and may be referred to as an adhesive material, adhesive layer, or a glue layer in such applications. In this example where material 220 serves as an adhesive layer, the type of material used may be selected depending on the phase chase material used in memory element 100. Using a suitable adhesive material to bond with the phase change material may reduce any problems with peeling. In the absence of material 220, the phase change material may directly contact insulating material 210 and may not bond sufficiently to insulating material 210.

Material 220 may also serve an as a thermal ground plane to reduce thermal disturb problems between adjacent memory elements. Thermal disturb problems may arise when a target or selected memory element is repeatedly heated during programming to place the phase change material of the memory element in, for example, an amorphous state. Due to scaling of memory devices where the distance between memory elements is reduced, during heating of the target memory element, unselected memory elements adjacent to the target memory element may also be heated. Over time, this inadvertent heating of the adjacent unselected memory elements may cause the unselected memory elements to change states erroneously. As stated above, thermal disturb problems may be reduced by providing material 220 at an appropriate thickness to serve as a thermal ground plane. Increasing the thickness of material 220 may improve thermal dissipation, thereby improving the thermal isolation between adjacent memory elements.

Examples of material 220 may include materials comprising polysilicon or titanium, although the scope of the claimed subject matter is not limited in this respect. The thickness and the technique used to formed material 220 may be selected depending on the desired characteristics of memory element 100. In one embodiment, material 220 may have a thickness ranging from about 200 angstroms to about 2,500 angstroms, although the scope of the present invention is not limited in this respect. In one embodiment, material 220 may be formed using a physical vapor deposition (PVD), LPCVD, or a PECVD process.

Figure 7:
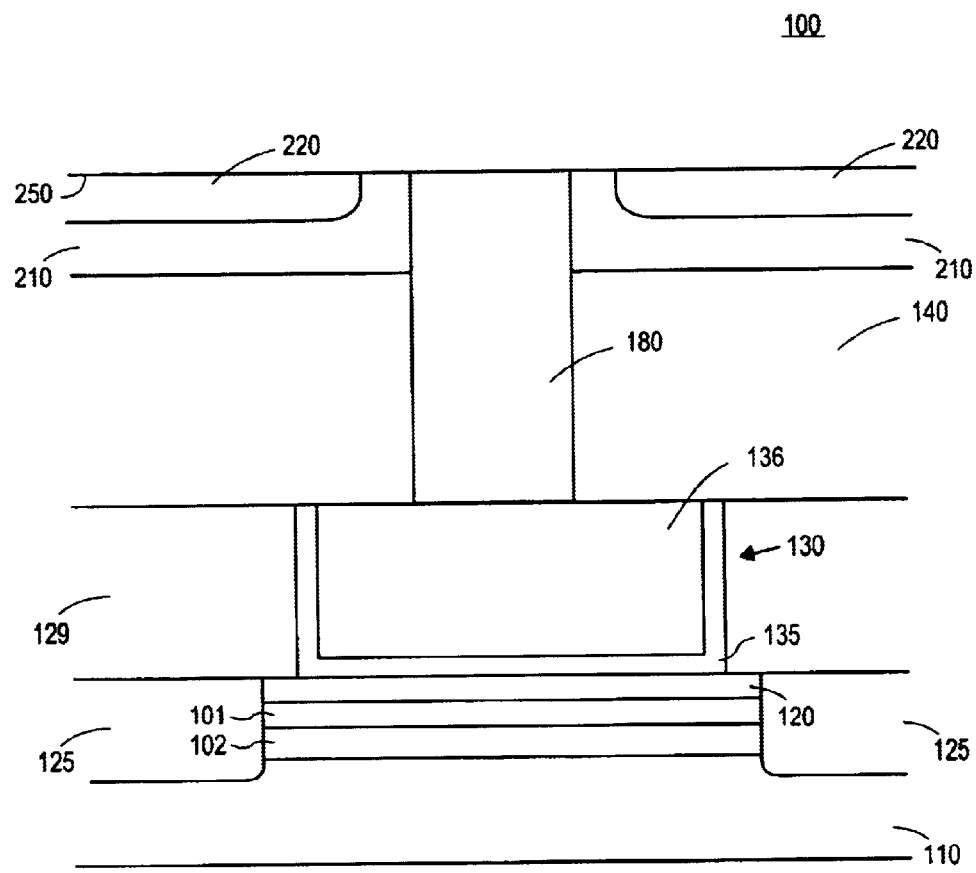
FIG. 7 is a cross-sectional view of the structure of FIG. 6 at a later stage of fabrication.

FIG. 7 illustrates the structure of FIG. 6 after removal of portions of materials 180, 210, and 220. A portion of the material 220, a portion of the insulating material 210, and a portion of electrode material 180 may form a substantially planar surface 250. In one embodiment, the structure shown in FIG. 6 may be subjected to a planarization process such as, for example, a CMP process, that removes portions of electrode material 180, insulating material 210, and material 220.

As is seen in FIG. 7, portions of materials 180, 210, and 220 may be removed to expose a portion of electrode material 180. Turning briefly to FIG. 8, what is shown is a top view of memory element 100 at the stage of manufacture illustrated in FIG. 7. In the embodiment illustrated in FIGS. 7 and 8, material 220 may surround an upper portion of electrode material 180 and may be separated from electrode material 180 by insulating material 210. In addition, insulating material 210 may surround and contact an upper portion of the sidewalls of electrode material 180.

FIG. 9 illustrates the structure shown in FIG. 7 after forming a programmable material such as, for example, a phase change material 300 on planar surface 250. As is illustrated in FIG. 9, phase change material 300 may overlie and contact a portion of material 220, a portion of insulating material 210, and a portion of electrode material 180.

Examples of phase change material 300 may include, but are not limited to, chalcogenide element(s) compositions of the class of tellurium-germanium-antimony (Te$_x$Ge$_y$Sb$_z$) material or GeSbTe alloys, although the scope of the present invention is not limited to just these. Alternatively, another phase change material may be used whose electrical properties (e.g. resistance) may be changed through the application of energy such as, for example, light, heat, or electrical current. In one embodiment, phase change material 300 may have a thickness ranging from about 150 angstroms to about 1,500 angstroms, although the scope of the present invention is not limited in this respect. In one embodiment, phase change material 300 may be formed using a PVD process.

After forming phase change material 300, a barrier material 310 may be formed overlying phase change material 300 and a conductive material 320 may be formed overlying barrier material 310. Barrier material 310 may serve, in one aspect, to prevent any chemical reaction between phase change material 300 and conductive material 320. Although the scope of the present invention is not limited in this respect, barrier material 310 may be titanium, titanium nitride, or carbon, and conductive material 320 may comprise, for example, aluminum. Barrier material 310 is an optional layer. In alternate embodiments, conductive material 320 may be formed overlying phase change material 300.

Conductive material 320 may serve as an address line to address and program phase change material 300 of memory element 100. Conductive material 320 may be referred to as a bitline or column line. Reducer material 120 may also serve as an address line to program phase change material 300 and may be referred to as a wordline or row line. Although not shown, electrode material 180 may be coupled to an access device such as, for example, a diode or transistor, via reducer material 120. The access device may also be referred to as an isolation device, a select device, or a switching device.

Programming of phase change material 300 to alter the state or phase of the material may be accomplished by applying voltage potentials to conductive material 320 and reducer material 120. A voltage potential applied to reducer material 120 may be transferred to electrode material 180 via conductive plug 130. For example, a voltage potential difference of about five volts may be applied across the phase change material 300 and a bottom portion of electrode 180 by applying about five volts to conductive material 320 and about zero volts to the bottom portion of electrode material 180. A current may flow through phase change material 300 and electrode 180 in response to the applied voltage potentials, and may result in heating of phase change material 300. This heating and subsequent cooling may alter the memory state or phase of phase change material 300.

During programming, insulating materials 140 and 210 may provide electrical and thermal isolation and material 220 may serve as a thermal ground plane as discussed above.

Memory element 100 shown in FIG. 9 may be referred to as a vertical phase change memory structure since current may flow vertically through phase change material 300 between upper and lower electrodes. It should be noted that memory element 100 may also be referred to as a memory cell and may be used in a phase change memory array having a plurality of memory elements 100 for storing information.

In other embodiments, memory element 100 may be arranged differently and include additional layers and structures. For example, it may be desirable to form isolation structures, peripheral circuitry (e.g., addressing circuitry), etc. It should be understood that the absence of these elements is not a limitation of the scope of the present invention.

The embodiment of memory element 100 illustrated in FIG. 9 provides a self-aligned adhesive layer offset from a raised bottom electrode by an insulating spacer.

FIG. 10 illustrates the structure of FIG. 5 at a later stage of fabrication in accordance with another embodiment for manufacturing memory element 100. In this embodiment, insulating material 210 may be patterned using, for example, etching techniques, to form spacers 210A along the sidewalls of electrode material 180. After forming spacers 210A, material 220 may be formed overlying insulating material 140, spacers 210A, and the top surface of electrode material 180.

FIG. 11 illustrates the structure of FIG. 10 after the removal of portions of materials 180, 210A, and 220. A portion of the material 220, a portion of spacers 210A, and a portion of electrode material 180 may form a planar surface 250. In one embodiment, the structure shown in FIG. 10 may be subjected to a planarization process such as, for example, a CMP process, that removes portions of electrode material 180, spacers 210A, and material 220. In another embodiment, an etching process may be used to form planar surface 250. After forming planar surface 250, a phase change material may be disposed on planer surface 250.

Figure 12:
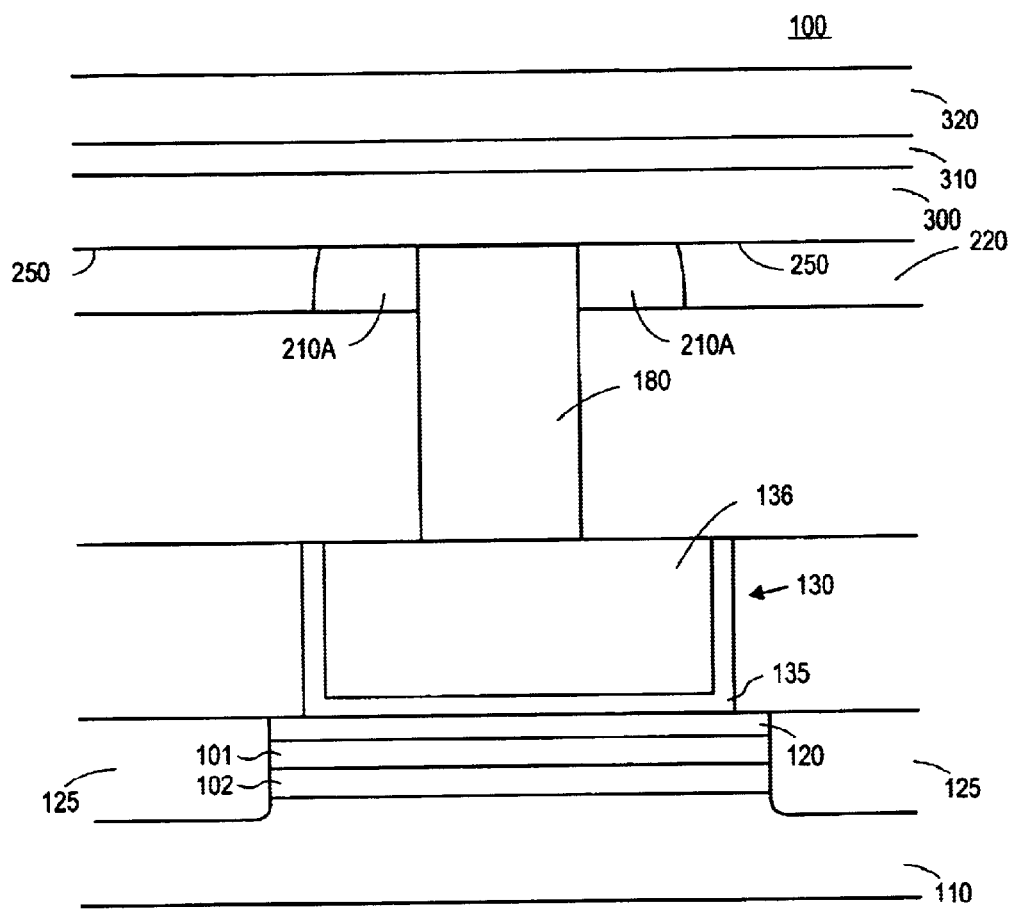
FIG. 12 is a cross-sectional view of the structure of FIG. 11 at a later stage of fabrication in accordance with another embodiment of the present invention.

FIG. 12 illustrates the structure shown in FIG. 11 after forming a programmable material such as, for example, a phase change material 300 on planar surface 250. As is illustrated in FIG. 12, phase change material 300 may overlie and contact a portion of material 220, a portion of spacers 210A, and a portion of electrode material 180. After forming phase change material 300, a barrier material 310 may be formed overlying phase change material 300 and a conductive material 320 may be formed overlying barrier material 310.

Figure 13:
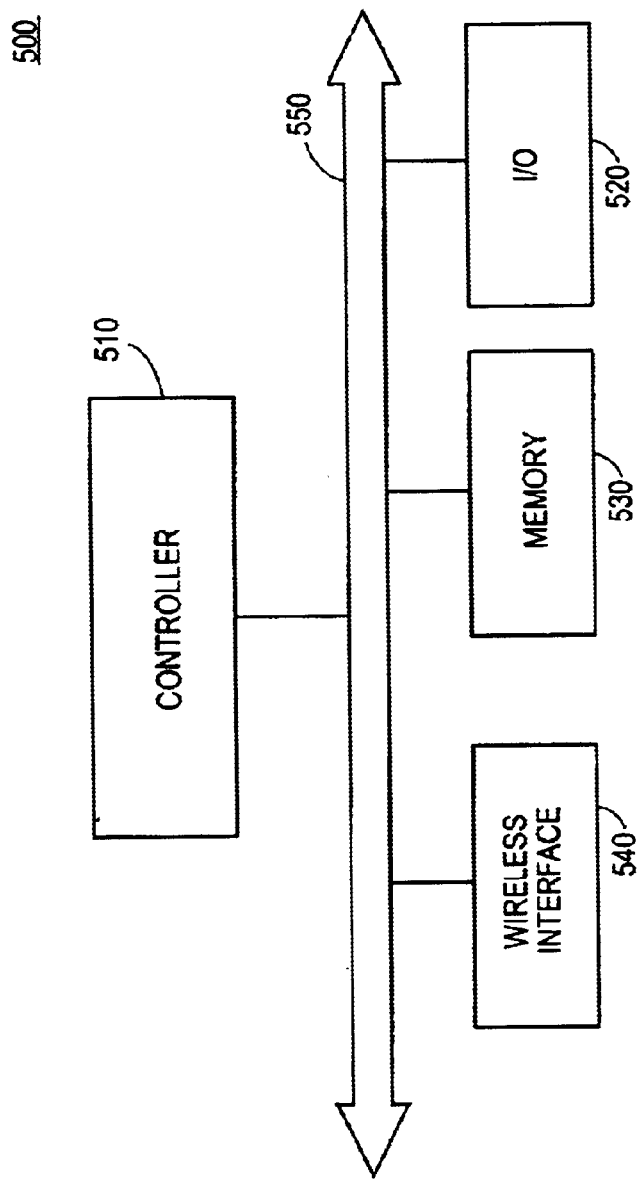
FIG. 13 is a block diagram illustrating a portion of a system in accordance with an embodiment of the present invention.

Turning to FIG. 13, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, and a wireless interface 540 coupled to each other via a bus 550. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise a volatile memory (any type of random access memory), a non-volatile memory such as a flash memory and/or a phase change memory that includes a memory element such as, for example, memory element 100 illustrated in FIGS. 9 or 12.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

Although the scope of the present invention is not limited in this respect, system 500 may use one of the following communication air interface protocols to transmit and receive messages: Code Division Multiple Access (CDMA), cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, or the like.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An apparatus, comprising:
   an electrode;
   an adhesive material;
   a dielectric material between the electrode and the adhesive material, wherein a portion of the adhesive material, a portion of the dielectric material, and a portion of the electrode form a substantially planar surface; and
   a phase change material on the substantially planar surface and contacting the electrode, the adhesive material, and the dielectric material.

2. The apparatus of claim 1, wherein the dielectric material contacts a portion of a sidewall of the electrode.

3. The apparatus of claim 2, wherein the adhesive material surrounds a portion of the electrode and is separated from the electrode by the dielectric material.

4. The apparatus of claim 1,
   wherein the adhesive material comprises polysilicon or titanium;
   wherein the electrode comprises titanium, tungsten, titanium nitride (TiN), titanium aluminum nitride (TiAlN), or titanium silicon nitride (TiSiN); and
   wherein the dielectric material comprises an oxide, a nitride, or a low k dielectric material.

5. The apparatus of claim 1, wherein the phase change material comprises a chalcogenide material.

6. The apparatus of claim 1, wherein the electrode is coupled to an address line.

7. The apparatus of claim 1, further comprising a conductive material over the phase change material.

8. The apparatus of claim 7, wherein the conductive material comprises aluminum.

9. An apparatus, comprising:
   an electrode material;
   a conductive material;
   an insulating material between the electrode material and the conductive material, wherein a portion of the conductive material, a portion of the insulating material, and a portion of the electrode material form a substantially planar surface; and
   a programmable material on the substantially planar surface and contacting the electrode material, the conductive material, and the insulating material.

10. The apparatus of claim 9, wherein the conductive material comprises polysilicon or titanium.

11. The apparatus of claim 9, wherein the programmable material is a phase change material.

12. The apparatus of claim 9, wherein the conductive material serves as a thermal ground plane.

13. The apparatus of claim 9, wherein the insulating material surrounds and contacts an upper portion of the electrode material.

14. The apparatus of claim 9, wherein the insulating material contacts a portion of a sidewall of the electrode material.

15. The apparatus of claim 9, wherein the conductive material surrounds an upper portion of the electrode material and is separated from the electrode material by the insulating material.

16. A method, comprising:
   forming an adhesive material surrounding a portion of an electrode;
   removing a portion of the adhesive material and a portion of the electrode to expose a portion of the electrode; and
   forming a phase change material overlying the adhesive material and the electrode.

17. The method of claim 16, further comprising forming an insulating material between the adhesive material and the electrode and wherein forming a phase change material includes forming the phase change material overlying the insulating material.

18. The method of claim 17, wherein removing further comprising removing a portion of the insulating material.

19. The method of claim 18, wherein removing includes using a chemical-mechanical polish (CMP) to remove portions of the adhesive material, the insulating material, and the electrode.

20. The method of claim 18, further comprising etching the insulating material to form a spacer prior to removing a portion of the insulating material.

21. The method of claim 17, wherein removing includes removing portions of the adhesive material, the electrode, and the insulating material to form a substantially planar surface and wherein forming a phase change material includes forming the phase change material on the substantially planar surface.

22. The method of claim 17, further comprising:
    forming an opening in a dielectric material;
    forming the electrode in the opening; and
    removing a portion of the dielectric material so that a top surface of the electrode is above a top surface of the dielectric material.

23. The method of claim 17, wherein forming the insulating material further includes forming the insulating material over a top surface of the electrode and on a portion of a sidewall of the electrode and wherein forming an adhesive material includes forming the adhesive material overlying the insulating material, wherein the adhesive material is separated from the electrode by the insulating material.

24. A system, comprising:
    a processor;
    a wireless interface coupled to the processor; and
    a memory coupled to the processor, the memory including:
        an electrode;
        an adhesive material;
        a dielectric material between the electrode and the adhesive material, wherein a portion of the adhesive material, a portion of the dielectric material, and a portion of the electrode form a substantially planar surface; and
        a phase change material on the substantially planar surface and contacting the electrode, the adhesive material, and the dielectric material.

25. The system of claim 24, wherein the dielectric material contacts a portion of a sidewall of the electrode.

26. The system of claim 25, wherein the adhesive material surrounds an upper portion of the electrode and is separated from the electrode by the dielectric material.

* * * * *

UNITED STATES PATENT AND TRADEMARK OFFICE
CERTIFICATE OF CORRECTION

PATENT NO. : 6,744,088 B1
DATED : June 1, 2004
INVENTOR(S) : Dennison

It is certified that error appears in the above-identified patent and that said Letters Patent is hereby corrected as shown below:

Column 2,
Line 61, delete "$1 \times 10^{0}$" and insert -- $1 \times 10^{20}$ --.

Signed and Sealed this

Twenty-third Day of November, 2004

JON W. DUDAS
*Director of the United States Patent and Trademark Office*